United States Patent
Pei

(10) Patent No.: US 7,439,120 B2
(45) Date of Patent: Oct. 21, 2008

(54) METHOD FOR FABRICATING STRESS ENHANCED MOS CIRCUITS

(75) Inventor: Gen Pei, Yorktown Heights, NY (US)

(73) Assignee: Advanced Micro Devices, Inc., Austin, TX (US)

( * ) Notice: Subject to any disclaimer, the term of this patent is extended or adjusted under 35 U.S.C. 154(b) by 77 days.

(21) Appl. No.: 11/464,090

(22) Filed: Aug. 11, 2006

(65) Prior Publication Data

US 2008/0038886 A1    Feb. 14, 2008

(51) Int. Cl.
*H01L 21/336* (2006.01)

(52) U.S. Cl. .............. 438/197; 257/E27.108

(58) Field of Classification Search ............ 438/197; 257/E21.108
See application file for complete search history.

(56) References Cited

U.S. PATENT DOCUMENTS

| | | | |
|---|---|---|---|
| 7,164,163 B2 | 1/2007 | Chen et al. | |
| 7,214,629 B1 | 5/2007 | Luo et al. | |
| 7,271,045 B2 | 9/2007 | Prince et al. | |
| 2005/0116360 A1* | 6/2005 | Huang et al. | 257/900 |
| 2006/0024879 A1 | 2/2006 | Fu et al. | |
| 2006/0160317 A1* | 7/2006 | Zhu et al. | 438/322 |
| 2006/0220113 A1* | 10/2006 | Tamura et al. | 257/335 |
| 2006/0286729 A1 | 12/2006 | Kavalieros et al. | |
| 2007/0045747 A1 | 3/2007 | Kohyama | |
| 2007/0099414 A1* | 5/2007 | Frohberg et al. | 438/618 |
| 2007/0108526 A1 | 5/2007 | Kohyama | |
| 2007/0138570 A1* | 6/2007 | Chong et al. | 257/371 |
| 2007/0246776 A1 | 10/2007 | Moroz et al. | |
| 2008/0014704 A1* | 1/2008 | Peidous et al. | 438/305 |

* cited by examiner

*Primary Examiner*—Thao P. Le
(74) *Attorney, Agent, or Firm*—Ingrassia Fisher & Lorenz, P.C.

(57) ABSTRACT

A stress enhanced MOS circuit and methods for its fabrication are provided. The stress enhanced MOS circuit comprises a semiconductor substrate and a gate insulator overlying the semiconductor substrate. A gate electrode overlies the gate insulator; the gate electrode has side walls and comprising a layer of polycrystalline silicon having a first thickness in contact with the gate insulator and a layer of electrically conductive stressed material having a second thickness greater than the first thickness overlying the layer of polycrystalline silicon. A stress liner overlies the side walls of the gate electrode.

15 Claims, 3 Drawing Sheets

US 7,439,120 B2

METHOD FOR FABRICATING STRESS ENHANCED MOS CIRCUITS

TECHNICAL FIELD

The present invention generally relates to stress enhanced MOS circuits and to methods for their fabrication, and more particularly relates to replacement gate fabrication methods and to stress enhanced MOS circuits made by those methods.

BACKGROUND

The majority of present day integrated circuits (ICs) are implemented by using a plurality of interconnected field effect transistors (FETs), also called metal oxide semiconductor field effect transistors (MOSFETs), or simply MOS transistors. An MOS transistor includes a gate electrode as a control electrode and spaced apart source and drain regions between which a current can flow. A control voltage applied to the gate electrode controls the flow of current through a channel between the source and drain regions.

The gain of an MOS transistor, usually defined by the transconductance ($g_m$), is proportional to the mobility ($\mu$) of the majority carrier in the transistor channel. The current carrying capability and hence the performance of an MOS transistor is proportional to the mobility of the majority carrier in the channel. The mobility of holes, the majority carrier in a P-channel MOS (PMOS) transistor, and the mobility of electrons, the majority carrier in an N-channel MOS (NMOS) transistor, can be enhanced by applying an appropriate stress to the channel. The known stress engineering methods greatly enhance circuit performance by increasing device drive current without increasing device size and device capacitance.

Accordingly, it is desirable to provide stress enhanced MOS transistors and circuits. In addition, it is desirable to provide methods for the fabrication of stress enhanced MOS transistors and circuits utilizing such transistors. Furthermore, other desirable features and characteristics of the present invention will become apparent from the subsequent detailed description and the appended claims, taken in conjunction with the accompanying drawings and the foregoing technical field and background.

BRIEF SUMMARY

A stress enhanced MOS circuit is provided. In accordance with one embodiment the stress enhanced MOS circuit comprises a semiconductor substrate and a gate insulator overlying the semiconductor substrate. A gate electrode overlies the gate insulator; the gate electrode has side walls and comprises a layer of polycrystalline silicon in contact with the gate insulator and having a first thickness and a layer of electrically conductive stressed material having a second thickness greater than the first thickness overlying the layer of polycrystalline silicon. A stress liner overlies the side walls of the gate electrode.

Methods are provided for fabricating a stress enhanced MOS circuit. In accordance with one embodiment the method comprises the steps of depositing and patterning a dummy gate material to form a dummy gate electrode and depositing a layer of insulating material overlying the dummy gate electrode. A portion of the layer of insulating material is removed to expose a top portion of the dummy gate electrode and at least a portion of the dummy gate electrode is removed to leave a void. The void is filled with a stressed material to complete a permanent gate electrode.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Figure 1:
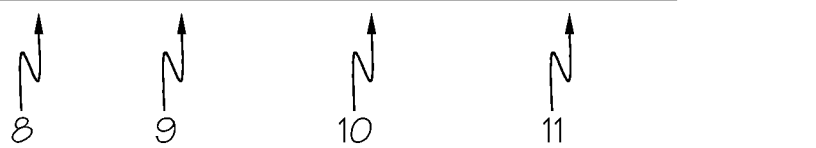
FIG. 1 shows in table form the mobility change resulting from a stress applied to the channel of an MOS transistor in various directions.

FIG. 1 shows the mobility change resulting from a stress of 1 Giga Pascal (GPa) applied to the channel of an MOS transistor in various directions. The results shown in the figure apply to an MOS transistor channel formed in a (100) silicon wafer and oriented in a [110] crystal direction. Columns 8 and 9 relate to the application of a tensile stress applied to the channel of an NMOS transistor and to a PMOS transistor, respectively. In like manner columns 10 and 11 relate to the application of a compressive stress applied to the channel of an NMOS transistor and to a PMOS transistor, respectively. Row 12 indicates the result of application of the stress in the longitudinal direction along the channel length; row 13 indicates the result of application of the stress in the transverse direction along the channel width; and row 14 indicates the result of application of the stress in a direction perpendicular to the plane of the channel. It is readily apparent that application of a stress, either tensile or compressive, applied to the channel of an MOS transistor can either enhance or degrade the majority carrier mobility depending on the direction of application of the stress and whether the majority carrier is a hole or an electron.

FIGS. 2-6 illustrate a stress enhanced MOS circuit 20 and specifically one exemplary MOS transistor of that circuit and method steps for manufacturing such an MOS circuit in accordance with various embodiments of the invention. In these illustrative embodiments the exemplary MOS transistor is a stress enhanced N-channel MOS (NMOS) transistor, although similar method steps can be used to manufacture a stress enhanced P-channel MOS (PMOS) transistor as will be explained below. Likewise, similar method steps can used to manufacture stress enhanced complementary MOS (CMOS) circuits that use a plurality of stress enhanced NMOS and/or PMOS transistors with or without conventional MOS transistors coupled together to implement a desired integrated circuit. Various steps in the manufacture of MOS transistors are well known and so, in the interest of brevity, many conventional steps will only be mentioned briefly herein or will be omitted entirely without providing the well known process details. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator)

which, in turn, is positioned over a semiconductor substrate. The material selected for the gate electrode of an MOS transistor must have the proper work function to provide the proper threshold voltage of the MOS transistor. In accordance with an embodiment of the invention the gate electrode material is also selected to have an appropriate stress, compressive for NMOS transistors and tensile for PMOS transistors, and to transfer stress to the channel of the transistor through the gate electrode to enhance the mobility of majority carriers in the channel. However, it is hard to find materials that give both the right work function and the right stress. Accordingly a gate electrode structure is provided that comprises two layers, a first thin layer to fix the threshold voltage and second thicker layer to transfer stresses into the channel. The material of the first layer is chosen based on the work function requirement of the devices. The material of the second layer is chosen based on stress, thermal stability, and interface requirements. The stress in the second layer ideally remains unchanged during the back end processing of the devices. The interface between the first layer and second layer should therefore be electrically conducting and chemically stable so that the stresses in the second layer can be effectively transferred to the first layer and then, in turn, to the channel.

Figure 2:
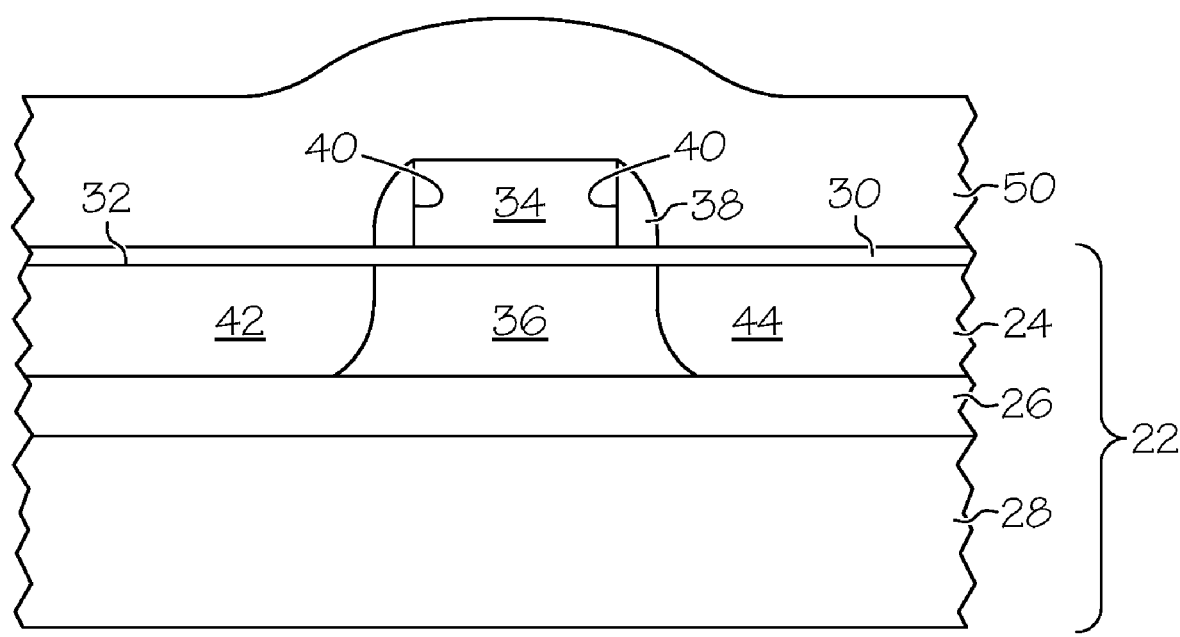
FIGS. 2-6 illustrate, in cross section, an MOS transistor and methods for its fabrication in accordance with various embodiments of the invention.

As illustrated in FIG. 2, the manufacture of a stress enhanced MOS circuit 20 in accordance with an embodiment of the invention begins with providing a P-type semiconductor substrate 22 and forming a stress enhanced MOS transistor in and on that semiconductor substrate. The initial steps in the fabrication of MOS circuit 20 are conventional and will not be described in detail. The semiconductor substrate is preferably a silicon substrate having a (100) surface crystal orientation wherein the term "silicon substrate" is used herein to encompass the relatively pure silicon materials typically used in the semiconductor industry as well as silicon admixed with other elements such as germanium, carbon, and the like. Alternatively, the semiconductor substrate can be germanium, gallium arsenide, or other semiconductor material. Semiconductor substrate 22 will hereinafter be referred to for convenience but without limitation as a silicon substrate. Silicon substrate 22 may be a bulk silicon wafer (not illustrated), or may be a thin layer of silicon 24 on an insulating layer 26 (commonly know as silicon-on-insulator or SOI) that, in turn, is supported by a carrier wafer 28. Thin silicon layer 24 typically has a thickness of about 20-100 nanometers (nm) depending on the circuit function being implemented, and preferably has a thickness of about 40-60 nm. A layer of gate insulator 30 is formed on surface 32 of silicon layer 24. The gate insulator may be thermally grown silicon dioxide formed by heating the silicon substrate in an oxidizing ambient, or may be a deposited insulator such as a silicon oxide, silicon nitride, a high dielectric constant insulator such as HfSiO, or the like. Deposited insulators can be deposited, for example, in known manner by chemical vapor deposition (CVD), low pressure chemical vapor deposition (LPCVD), semi-atmospheric chemical vapor deposition (SACVD), or plasma enhanced chemical vapor deposition (PECVD). The gate insulator material is typically 1-10 nm in thickness. In accordance with one embodiment of the invention a layer of gate electrode forming material, preferably polycrystalline silicon, is deposited onto the layer of gate insulator. Other electrically conductive gate electrode forming materials such as metals and metal silicides may also be deposited providing the material by itself or with appropriate impurity doping can set the necessary threshold voltage of the transistor. The gate electrode forming material will hereinafter be referred to as polycrystalline silicon although those of skill in the art will recognize that other materials can also be employed. The gate electrode forming material may also be referred to as a dummy gate material for reasons that will become apparent from the following description. If the gate electrode material is polycrystalline silicon, that material is typically deposited to a thickness of about 50-200 nm and preferably to a thickness of about 100 nm by LPCVD by the hydrogen reduction of silane. The layer of polycrystalline silicon is preferably deposited as undoped polycrystalline silicon and is subsequently impurity doped by ion implantation. Although not illustrated, regions of electrically isolating material such as shallow trench isolation (STI) regions can be formed to extend into and preferably entirely through the thickness of silicon layer 24 to electrically isolate between transistors of the MOS circuit as required by the circuit function being implemented.

The polycrystalline silicon or other gate electrode forming material is photolithographically patterned and etched to form a dummy or temporary gate electrode 34. Dummy gate electrode 34 has substantially the same physical shape and orientation as a permanent gate electrode to be subsequently formed by a replacement process. Although only one MOS transistor is illustrated, in fabricating MOS circuit 20 a plurality of gate electrodes for a plurality of transistors would be patterned from the layer of gate electrode forming material at the same time. The pitch between adjacent dummy gate electrodes can be, for example, from about 250 nm to less than 200 nm and preferably less than 150 nm depending on the technology generation. Dummy gate electrode 34 overlies and defines a channel 36 at the surface of silicon layer 24. Preferably the channel is oriented so that current flow along the channel is in the direction. The length of the gate electrode determines the length of the channel. The channel length is selected based on the circuit function being implemented. Preferably the channel length is 90 nm or less and most preferably is less than 45 nm. Side wall spacers 38 are formed on the side walls 40 of dummy gate electrode 34. The sidewall spacers can be formed of an electrically insulating material such as silicon oxide, silicon nitride, silicon oxynitride, or the like. The side wall spacers can be formed in conventional manner by the deposition and subsequent anisotropic etching of a layer of side wall spacer material. The anisotropic etching can be done, for example, by reactive ion etching (RIE).

The dummy gate electrode and the side wall spacers are used as a mask and conductivity determining impurities are introduced into near surface regions of silicon layer 24 to form a source region 42 and a drain region 44. Preferably the conductivity determining dopants are introduced into the silicon layer by ion implantation. For an NMOS transistor the implanted ions can be, for example, either phosphorus or arsenic ions. Although only one set of side wall spacers and one set of ion implanted regions have been illustrated, those of skill in the art will understand that additional spacers may be used and additional implanted regions may be formed. As is well known, additional implantations can create halo regions, drain extensions, adjustments to the doping profile in the channel, and the like. The ion implantation or other impurity introducing process can also be used to impurity dope the polycrystalline silicon dummy gate electrode. The side wall spacers can also be used to form self aligned metal silicide contacts (not illustrated) to the source and drain regions.

In accordance with one embodiment of the invention, a stress liner 50 is blanket deposited to overlie the dummy gate electrode and the side wall spacers. The stress liner is formed of an electrically insulating material and can be, for example, a layer of stressed silicon nitride. The layer of silicon nitride can be deposited, for example, by LPCVD or PECVD from reactants including dichlorosilane and ammonia. The deposition conditions, reactants, and reactant flows can be adjusted, as is well known, to deposit either a tensile stress liner or a compressive stress liner. Preferably a tensile stress liner is deposited overlying an NMOS transistor and a compressive stress liner is deposited overlying a PMOS transistor. An additional insulating layer (not illustrated) can also be deposited to add to the thickness of the stress liner and to completely fill the volume between adjacent dummy gate electrodes.

Figure 3:
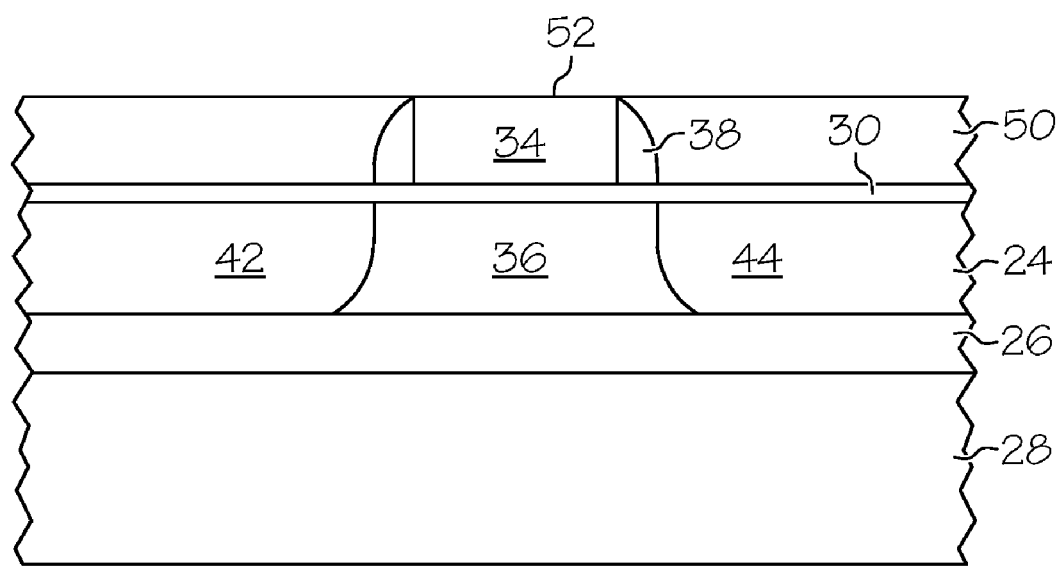

As illustrated in FIG. 3, the method in accordance with one embodiment of the invention continues by exposing a top surface 52 of dummy gate electrode 34. Preferably the top portion of dummy gate electrode 34 is exposed by a process of chemical mechanical polishing (CMP) of stress liner 50 and any overlying insulating material if such insulating material was deposited over the stress liner. The CMP process planarizes the stress liner and insulating material and exposes the top surface of the dummy gate electrode.

Figure 4:
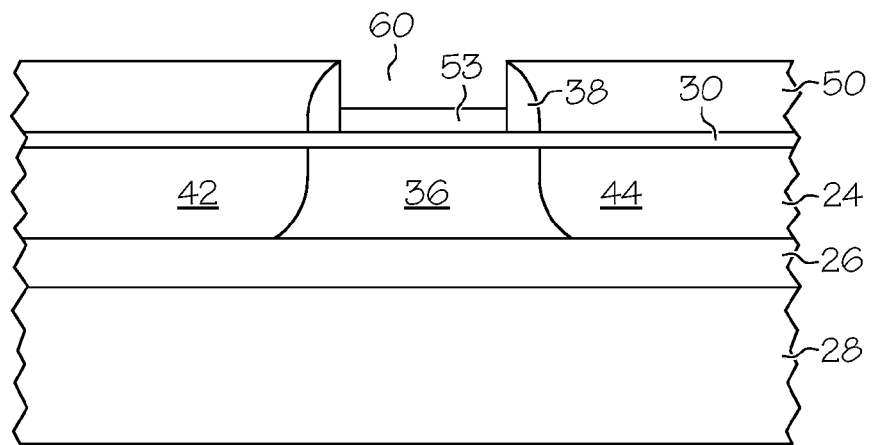

In accordance with one embodiment of the invention exposed top surface 52 of polycrystalline silicon dummy gate electrode 34 is etched to reduce the thickness of the polycrystalline silicon as illustrated in FIG. 4. Preferably the thickness of the retained polycrystalline silicon 53 is reduced to about 10-20 nm or about 10-20% of the original thickness of the dummy gate electrode. The remaining thickness is preferably the minimum thickness that will provide a stable work function and fix the threshold voltage of the device; a thicker retained layer causes the stress transfer from a subsequently deposited overlying layer to the channel to be less efficient. The polycrystalline silicon can be etched, for example, by plasma etching in a Cl or $HBr/O_2$ chemistry. The remaining stress liner 50 and/or insulating layer provides an etch mask during the etching of the polycrystalline silicon. The etching results in a void 60 bounded on the sides by side wall spacers 38 and the stress liner. Polycrystalline silicon 53 retained at the bottom of the dummy gate electrode is sufficient to fix the threshold voltage of the MOS transistor. The threshold voltage is a function of a number of parameters including the work function of the gate electrode relative to the impurity doping in the transistor channel. The work function is determined, in part, by the impurity doping in the retained polycrystalline silicon.

Figure 5:
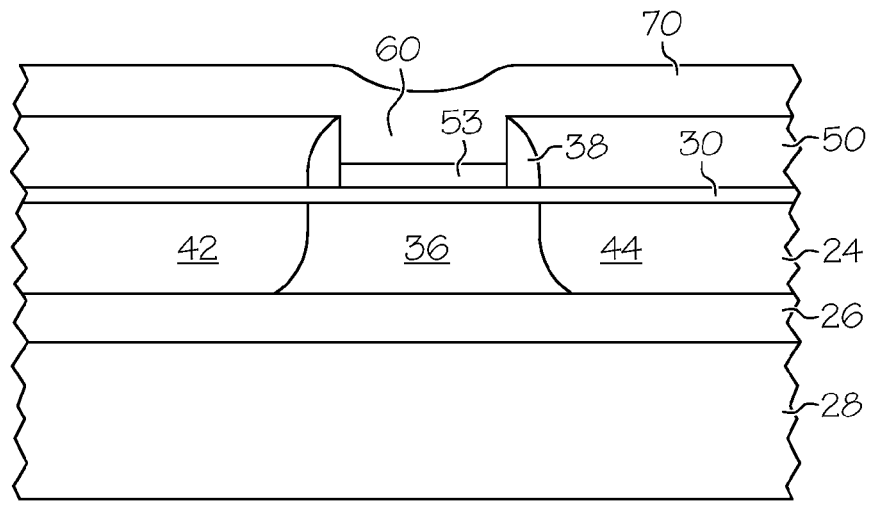
Figure 6:
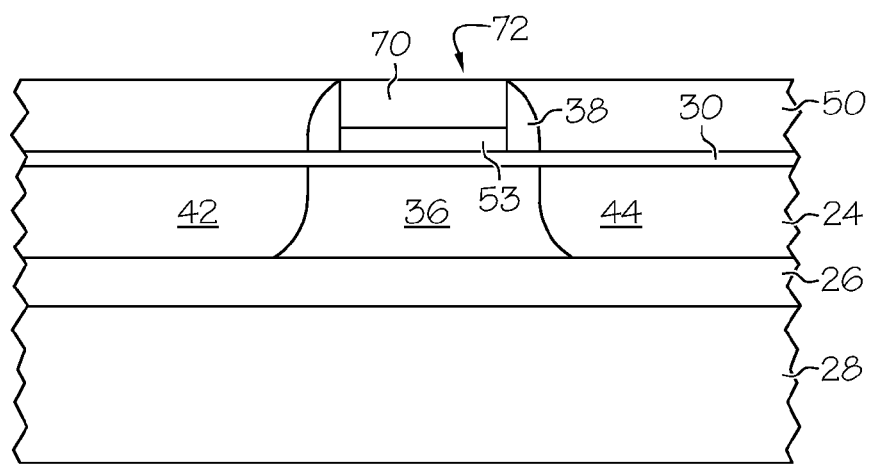

The removed portion of polycrystalline silicon dummy gate electrode 34 is replaced, for the exemplary NMOS transistor, by depositing a layer of compressive stressed electrically conductive gate electrode material 70 as illustrated in FIG. 5. Preferably the compressive stressed gate electrode material is titanium nitride with a compressive stress of greater than about −2.5 GPa and most preferably about −10 GPa. Compressive stressed titanium nitride can be deposited by known chemical vapor deposition methods. The compressive stressed gate electrode material is deposited to a thickness sufficient to fill void 60. The excess deposited gate electrode material is removed from the top surface of the stress liner layer by CMP, selective etching, or the like. The resultant structure, as illustrated in FIG. 6 includes a replacement gate electrode 72 that includes the remaining portion 53 of dummy gate electrode 34 overlaid by a compressive stressed material 70. Preferably the compressive stressed material has a thickness of at least about 50-80 nm or at least about five times the thickness of the remaining dummy gate electrode material.

Stress enhanced MOS circuit 20 is completed in conventional manner by providing electrical contacts to the source region, drain region, and gate electrode 72. The conventional processing may include, for example, depositing interlayer dielectrics, etching contact vias, filling the contact vias with conductive plugs, and the like as are well known to those of skill in the art of fabricating semiconductor circuits.

Figure 7:
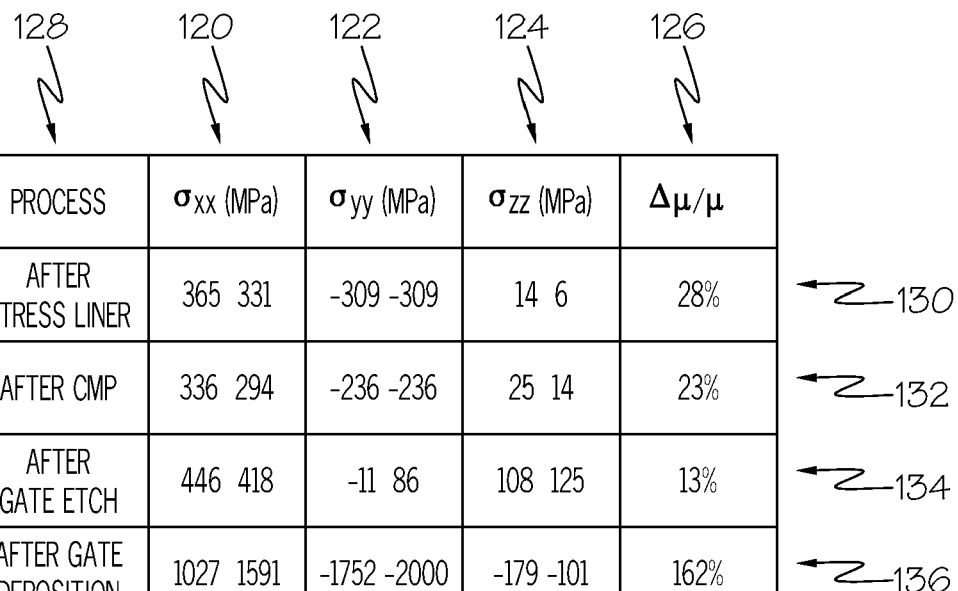
FIG. 7 shows stress simulation and mobility enhancement results at various steps in the method in accordance with embodiments of the invention.

The replacement gate method, in accordance with the invention, is particularly efficient at maintaining stress in the stressed gate electrode layer and transferring that stress to the channel. The stress in most gate electrode forming materials and especially in metallic materials is relaxed by thermal processing. In the inventive replacement gate process most of the thermal processing, such as the thermal annealing of the source and drain implants, is completed before the deposition of the stressed gate electrode forming material. The back end processing that takes place after the deposition of the stressed material deposition has a minimal thermal budget. Additionally, in order for the stress from the gate to be transferred most effectively to the channel, a certain amount of confinement is needed around the gate electrode. Such confinement is provided in the inventive method by the side wall spacers and the stress liner layer that are present around the gate electrode region when the stressed gate electrode material is deposited and planarized so the stress transfer to the channel is very effective FIG. 7 indicates stress simulation results that show the stress evolution and mobility enhancement results during the process of fabricating an NMOS circuit in the manner just described. The simulation was conducted for an N-channel MOS SOI transistor of an MOS circuit formed in and over a (100) silicon layer having a thickness of 55 nm. The channel of the NMOS transistor was oriented in the direction. The gate oxide was 1 nm in thickness and the gate electrode width was 30 nm with a gate to gate pitch of 130 nm. A tensile stress of 1.2 GPa was assumed in the silicon nitride stress liner and a compressive stress of −10 GPa was assumed in the titanium nitride replacement gate electrode. Stress was measured in the transistor channel 1 nm below the gate oxide. Two stress measurements were made, one in line with the edge of the gate electrode and one in the center of the channel. The electron mobility ($\mu$) and mobility enhancement ($\Delta\mu$) were estimated using an average stress in the channel and bulk piezoresistance coefficients. In FIG. 7 column 120 indicates the resulting longitudinal stress along the channel length, column 122 indicates the resulting vertical stress perpendicular to the channel, column 124 indicates the resulting transverse stress in the channel width direction, and column 126 indicates the mobility enhancement. Column 128 indicates the method step completed. Row 130 indicates the stress and mobility enhancement after deposition of the stress liner, row 132 indicates the stress and mobility enhancement after CMP of the stress liner, row 134 indicates the stress and mobility enhancement after the etch of the dummy gate electrode, and row 136 indicates the stress and mobility enhancement after deposition of the compressive stressed replacement gate. Each of the stress entries shows two values for the simulated stress measurement; the first entry is the simulated stress measurement at the gate edge and the second entry is the simulated stress measurement at the center of the channel. For example, for the entry in column 120 and row 136 the simulated stress measurement at the gate edge is a tensile 1.027 GPa, and the simulated stress measurement at the center of the channel is a tensile 1.591 GPa. As the simulation shows, fabricating an MOS circuit in accordance with an embodiment of the invention results in a majority carrier electron mobility enhancement of approximately 2.6 times the value of the mobility of a conventional device and approximately 2 times the value of the mobility of a transistor that is conventional except for the use of a stress liner.

The foregoing description has provided methods for fabricating an NMOS transistor of a stress enhanced MOS circuit.

Similar method steps can be used to fabricate a PMOS transistor with an appropriate change in impurity doping type in the semiconductor substrate and in the source and drain regions. Additionally, the upper portion of the dummy gate electrode must be replaced by a tensile stressed electrically conductive gate electrode material and the stress liner should be compressive stressed. Preferably the tensile stressed electrically conductive gate electrode material has a tensile stress of at least 2.0 GPa.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof. For example, the embodiments described herein can be combined with other techniques know in the art for enhancing majority carrier mobility in the transistor channel. One such example is the selective growth of embedded silicon germanium in the source and drain regions of a PMOS transistor to increase the compressive longitudinal stress in the channel. Additionally, the stressed replacement gate method in accordance with an embodiment invention can be used either with or without the use of a stress liner.

What is claimed is:

1. A method for fabricating a stress enhanced MOS circuit, the method comprising the steps of:
   depositing a layer of polycrystalline silicon gate forming material onto a layer of gate insulator;
   etching the layer of polycrystalline silicon gate forming material to form a polycrystalline silicon gate structure overlying the layer of gate insulator;
   depositing a stress liner layer in contact with the polycrystalline silicon gate structure formed from the layer of polycrystalline silicon gate forming material;
   planarizing the stress liner layer to expose a top portion of the polycrystalline silicon gate structure;
   etching the polycrystalline silicon gate structure to remove a first portion of the polycrystalline silicon gate structure, leaving a second portion of the polycrystalline silicon gate structure in contact with the gate insulator, and leaving an etched void bounded in part by the stress liner layer;
   filling the void with an electrically conductive stressed material, wherein the electrically conductive stressed material contacts the polycrystalline silicon gate structure; and
   planarizing a surface of the electrically conductive stressed material.

2. The method of claim 1 wherein the step of filling the void comprises the step of filling the void with a compressive stressed titanium nitride.

3. The method of claim 2 wherein the step of depositing a stress liner layer comprises the step of depositing a layer of tensile stressed silicon nitride.

4. The method of claim 1 wherein the step of filling the void comprises the step of filling the void with a tensile stressed material.

5. The method of claim 4 wherein the step of depositing a stress liner layer comprises the step of depositing a layer of compressive stressed silicon nitride.

6. A method for fabricating a stress enhanced MOS circuit, the method comprising the steps of:
   depositing and etching a layer of polycrystalline silicon gate material to form a dummy polycrystalline silicon gate electrode;
   depositing a layer of insulating material in contact with the dummy polycrystalline silicon gate electrode formed from the layer of polycrystalline silicon gate forming material;
   removing a portion of the layer of insulating material to expose a top portion of the dummy polycrystalline silicon gate electrode;
   removing at least a portion of the dummy polycrystalline silicon gate electrode to leave a void; and
   filling the void with a stressed material, wherein the stressed material contacts a remaining portion of the dummy polycrystalline silicon gate electrode.

7. The method of claim 6 wherein the stress enhanced MOS circuit is formed on a semiconductor substrate, the method further comprising the steps of:
   forming side wall spacers on the dummy gate electrode;
   implanting conductivity determining impurities into the semiconductor substrate to form source and drain regions self aligned to the dummy polycrystalline silicon gate electrode; and
   wherein the step of depositing a layer of insulating material comprises the step of depositing a layer of stressed silicon nitride overlying the side wall spacers and the source and drain regions.

8. The method of claim 7 wherein the step of depositing a layer of stressed silicon nitride comprises the step of depositing a layer of tensile stressed silicon nitride.

9. The method of claim 7 wherein the step of depositing a layer of stressed silicon nitride comprises the step of depositing a layer of compressive stressed silicon nitride.

10. The method of claim 6 wherein the step of depositing and etching a layer of polycrystalline silicon gate material comprises the steps of:
    depositing the layer of polycrystalline silicon gate material; and
    impurity doping the dummy layer of polycrystalline silicon gate material to establish a desired device threshold voltage.

11. The method of claim 10 wherein the step of removing at least a portion of the dummy polycrystalline silicon gate electrode comprises the step of etching the dummy polycrystalline silicon gate material and leaving at least 10 nm of polycrystalline silicon to fix the desired device threshold.

12. The method of claim 11 wherein the step of filling the void comprises the step of filling the void with a stressed material having a thickness of at least 80 nm.

13. The method of claim 6 wherein the step of filling the void comprises the step of filling the void with a compressive stressed material.

14. The method of claim 6 wherein the step of filling the void comprises the step of filling the void with compressive stressed titanium nitride.

15. The method of claim 6 wherein the step of filling the void comprises the step of filling the void with a tensile stressed material.

* * * * *